(12) United States Patent
Ryu et al.

(10) Patent No.: US 9,082,701 B2
(45) Date of Patent: Jul. 14, 2015

(54) TRENCH FORMING METHOD, METAL WIRING FORMING METHOD, AND METHOD OF MANUFACTURING THIN FILM TRANSISTOR ARRAY PANEL

(75) Inventors: Yong-Hwan Ryu, Yongin-si (KR); Dae Ho Kim, Daegu (KR); Hong Sick Park, Suwon-si (KR); Shin Il Choi, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 63 days.

(21) Appl. No.: 13/556,396

(22) Filed: Jul. 24, 2012

(65) Prior Publication Data
US 2013/0252384 A1    Sep. 26, 2013

(30) Foreign Application Priority Data
Mar. 22, 2012   (KR) .................. 10-2012-0029553

(51) Int. Cl.
| | | |
|---|---|---|
| H01L 21/336 | (2006.01) | |
| H01L 21/28 | (2006.01) | |
| H01L 21/311 | (2006.01) | |
| H01L 27/12 | (2006.01) | |
| H01L 21/768 | (2006.01) | |

(52) U.S. Cl.
CPC .......... *H01L 21/28* (2013.01); *H01L 21/31144* (2013.01); *H01L 21/76802* (2013.01); *H01L 27/124* (2013.01); *H01L 27/1248* (2013.01); *H01L 27/1262* (2013.01)

(58) Field of Classification Search
USPC ................................. 438/158, 151
See application file for complete search history.

(56) References Cited

U.S. PATENT DOCUMENTS

| | | | |
|---|---|---|---|
| 7,648,861 B2 * | 1/2010 | Yamazaki et al. ............ 438/149 |
| 7,767,569 B2 * | 8/2010 | Maekawa ...................... 438/596 |
| 2003/0216052 A1 | 11/2003 | Kakamu | |
| 2006/0099747 A1 | 5/2006 | Park | |
| 2006/0157851 A1 * | 7/2006 | Kawashima ................. 257/750 |
| 2006/0289385 A1 | 12/2006 | Kikuchi | |
| 2007/0082483 A1 | 4/2007 | Bai | |
| 2007/0111373 A1 * | 5/2007 | Ueda ............................ 438/105 |
| 2009/0087960 A1 | 4/2009 | Cho et al. | |
| 2009/0170335 A1 | 7/2009 | Tanaka et al. | |
| 2010/0221670 A1 | 9/2010 | Maekawa | |
| 2010/0327413 A1 | 12/2010 | Lee et al. | |
| 2011/0159693 A1 | 6/2011 | Sun | |
| 2011/0159696 A1 | 6/2011 | Ahn | |
| 2012/0329236 A1 * | 12/2012 | Ueda ............................ 438/381 |

FOREIGN PATENT DOCUMENTS

| | | |
|---|---|---|
| JP | 2006041163 A | 2/2006 |
| KR | 1020070002840 A | 1/2007 |
| KR | 1020080022398 A | 3/2008 |
| KR | 1020080032294 A | 4/2008 |

\* cited by examiner

*Primary Examiner* — Telly Green
*Assistant Examiner* — Damian A Hillman
(74) *Attorney, Agent, or Firm* — Cantor Colburn LLP

(57) ABSTRACT

A method of forming a thin film transistor array panel includes: forming a first insulating layer on a substrate; forming an amorphous carbon layer on the first insulating layer; forming a second insulating layer on the amorphous carbon layer; forming an opening in the amorphous carbon layer by patterning the second insulating layer and the amorphous carbon layer; and forming a trench in the first insulating layer by etching the first insulating layer, the etching the first insulating layer using the amorphous carbon layer including the opening as a mask.

9 Claims, 13 Drawing Sheets

TRENCH FORMING METHOD, METAL WIRING FORMING METHOD, AND METHOD OF MANUFACTURING THIN FILM TRANSISTOR ARRAY PANEL

This application claims priority to Korean Patent Application No. 10-2012-0029553 filed on Mar. 22, 2012, and all the benefits accruing therefrom under 35 U.S.C. §119, the entire contents of which are incorporated herein by reference.

BACKGROUND (a) Field

The invention relates to a trench forming method, a metal wiring forming method, and a method of manufacturing a thin film transistor array panel. More particularly, the invention relates to a trench forming method which allows etching at a high selectivity and prevents an interior of a trench from being contaminated, a metal wiring forming method, and a method of manufacturing a thin film transistor array panel.

(b) Description of the Related Art

In general, a thin film transistor ("TFT") is used as a switching device for independently driving each pixel in a flat panel display device such as a liquid crystal display or an organic light emitting diode display. A thin film transistor array panel of the flat panel display includes the thin film transistor, a pixel electrode connected to the thin film transistor, a gate line for transferring a gate signal to the thin film transistor, a data line for transferring a data signal, and the like.

The thin film transistor includes a gate electrode connected to a gate line to receive a gate signal, a semiconductor layer formed on the gate electrode, a source electrode formed on the semiconductor layer and connected to a data line to receive a data signal, and a drain electrode formed to be spaced apart from the source electrode and connected to a pixel electrode. In this case, the gate line, the gate electrode, the data line, the source electrode, the drain electrode, and the like are formed with metal wirings.

In order to increase resolution, there have been studies toward enhancement of pixel integrity per unit area in a thin film transistor array panel. Studies on methods of using a high electron mobility oxide semiconductor or a low-resistance copper wiring are being made to process image signals at a high speed.

In this case, it is necessary to, after depositing an insulating layer of several micrometers, form a trench and form a copper wiring in the trench in order to realize a low-resistance copper wiring. When a photo etching process using an existing photosensitive film as a mask is used to form a trench, selectivity of etching is disadvantageously very low.

A method of performing etching by using a metal mask instead of a photosensitive film is being studied, but if a metal mask is used, residue is produced in a trench so that a bottom of the trench cannot be etched, causing residual films to be left.

SUMMARY

The invention provides a trench forming method which allows etching at a high selectivity, a metal wiring forming method, and a method of manufacturing a thin film transistor array panel.

Further, the invention provides a trench forming method which prevents an interior of a trench from being contaminated, a metal wiring forming method, and a method of manufacturing a thin film transistor array panel.

An exemplary embodiment of the invention provides a method of forming a thin film transistor array panel, the method including: forming a first insulating layer on a substrate; forming an amorphous carbon layer on the first insulating layer; forming a second insulating layer on the amorphous carbon layer; forming an opening in the amorphous carbon layer by patterning the second insulating layer and the amorphous carbon layer; and forming a trench in the first insulating layer by etching the first insulating layer, the etching the first insulating layer using the amorphous carbon layer including the opening as a mask.

The first insulating layer may include at least one of SiN, SiO, SiC, SiOC, or SiON.

The second insulating layer may include at least one of SiN, SiO, or SiON.

The forming the opening may include: forming a photosensitive film on the second insulating layer, and exposing and developing the photosensitive film to pattern the photosensitive film; etching the second insulating layer by using the patterned photosensitive film as a mask; etching the amorphous carbon layer by using the second insulating layer as a mask, to form the opening; and removing the photosensitive film.

In the etching of the second insulating layer of the forming the opening and in the etching of the first insulating layer in the forming the trench, the second insulating layer and the first insulating layer may be etched by using the first primary etching gas including fluorine.

The first primary etching gas may include at least one of $SF_6$, $NF_3$, $CF_4$, $CHF_3$, $CH_2F_2$, $C_3F_8$, $C_4F_8$, $C_4F_6$, or $C_5F_8$.

In the etching of the amorphous carbon layer, the amorphous carbon layer may be etched by using a second primary etching gas including oxygen.

In the etching of the amorphous carbon layer, the amorphous carbon layer may be etched by further using an assistant etching gas, and the assistant etching gas may include at least one of hydrogen bromide or argon.

In the forming of the amorphous carbon layer, the amorphous carbon layer is formed by using a gas including carbon and hydrogen, and the gas including carbon and hydrogen may include at least one of $C_2H_4$, $C_3H_6$, or $C_4H_8$.

In the forming of the amorphous carbon layer, the amorphous carbon layer may be formed by further using an assistant gas, and the assistant gas may include at least one of helium and argon.

The forming of the amorphous carbon layer may include a chemical vapor deposition process.

The forming of the amorphous carbon layer may be performed at a temperature of about 50 degrees Celsius (° C.) to about 500° C.

Another exemplary embodiment of the invention provides a method of forming a thin film transistor array panel, the method including: forming a first insulating layer on the substrate; forming an amorphous carbon layer on the first insulating layer; forming a second insulating layer on the amorphous carbon layer; patterning the second insulating layer and the amorphous carbon layer, to form an opening in the amorphous carbon layer; etching the first insulating layer by using the amorphous carbon layer including the opening as a mask, to form a trench in the first insulating layer; removing the amorphous carbon layer; forming a metal layer on the substrate; and polishing the metal layer through a chemical mechanical polishing process, to form a metal wiring in the trench.

The metal wiring may include copper.

The first insulating layer may include at least one of SiN, SiO, SiC, SiOC, or SiON, and the second insulating layer may include at least one of SiN, SiO, or SiON.

The forming of the opening may include: forming a photosensitive film on the second insulating layer, and exposing and developing the photosensitive film, to pattern the photosensitive film; etching the second insulating layer by using the patterned photosensitive film as a mask; etching the amorphous carbon layer by using the second insulating layer as a mask, to form the opening; and removing the photosensitive film.

In the etching the second insulating layer of the forming the opening and in the etching of the first insulating layer of the forming the trench, the second insulating layer and the first insulating layer may be etched by using a first primary etching gas including fluorine, and in the etching of the amorphous carbon layer, the amorphous carbon layer may be etched by using a second primary etching gas including oxygen, and an assistant etching gas including at least one of hydrogen bromide or argon.

The forming of the amorphous carbon layer may include a chemical vapor deposition process, the chemical vapor deposition process using a gas including carbon and hydrogen, and the gas including carbon and hydrogen may include at least one of $C_2H_4$, $C_3H_6$, or $C_4H_8$.

Yet another exemplary embodiment of the invention provides a method of manufacturing a thin film transistor array panel, the method including: forming a first insulating layer on a substrate; forming an amorphous carbon layer on the first insulating layer; forming a second insulating layer on the amorphous carbon layer; patterning the second insulating layer and the amorphous carbon layer, to form an opening in the amorphous carbon layer; etching the first insulating layer by using the amorphous carbon layer including the opening as a mask, to form a trench in the first insulating layer; removing the amorphous carbon layer; forming a metal layer on the substrate; polishing the metal layer through a chemical mechanical polishing process, to form a gate electrode in the trench; forming a gate insulating film on the gate electrode; forming a semiconductor layer on the gate insulating film; forming a source electrode and a drain electrode on the semiconductor layer, the source electrode and the drain electrode spaced apart from each other; forming a passivation film on the source electrode and the drain electrode; forming a contact hole in the passivation film, the contact hole exposing a portion of the drain electrode; and forming a pixel electrode on the passivation film, the pixel electrode is connected to the drain electrode.

The metal wiring may include copper, the first insulating layer may include at least one of SiN, SiO, SiC, SiOC, or SiON, and the second insulating layer may include at least one of SiN, SiO, or SiON.

One or more embodiment of the trench forming method, the metal wiring forming method, and the method of manufacturing a thin film transistor array panel according to the invention have the following advantageous effects.

In one or more embodiment of the trench forming method, the metal wiring forming method, and the method of manufacturing a thin film transistor array panel according to the invention, a trench is formed by etching a first insulating layer, the etching the first insulating layer using an amorphous carbon layer as a mask, making it possible to increase selectivity of etching.

Further, by using the amorphous carbon layer as the mask instead of a metal mask, generation of metallic foreign substances in an interior of a trench of the first insulating layer can be reduced or effectively prevented. Since the generation of metallic foreign substances in the interior of the trench of the first insulating layer can be reduced or effectively prevented, the trench is not contaminated and it is possible to improve the selectivity of etching even at a bottom of the trench and accordingly, reduce or effectively prevent residual films from being left after the etching process.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
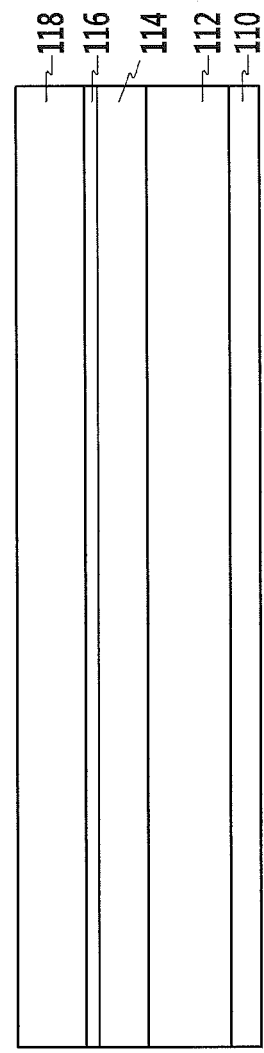
FIGS. 1 to 6 are cross-sectional views showing an exemplary embodiment of a trench forming method according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. As used herein, connected may refer to elements being physically and/or electrically connected to each other. As used herein, the term "and/or" includes any and all combinations of one or more of the associated listed items.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "upper" or "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

First, an exemplary embodiment of a trench forming method according to the invention will be described with reference to the accompanying drawings.

FIGS. 1 to 6 are cross-sectional views showing an exemplary embodiment of a trench forming method according to the invention.

First, as shown in FIG. 1, a first insulating layer 112 is formed on a substrate 110, and an amorphous carbon layer 114 is formed on the first insulating layer 112. The substrate 110 may include glass, plastic, or the like. Subsequently, a second insulating layer 116 is formed on the amorphous carbon layer 114, and a photosensitive film 118 is applied on the second insulating layer 116.

The first insulating layer 112 may include SiOC, and may have a thickness of approximately 3 microns (μm). SiOC is an insulating material having a low permittivity, and is a silicon oxide doped with carbon. SiOC may be formed by applying methyl silsesquioxane ("MSSQ"), or the like, in a Spin-On Glass (SOG) method. Alternatively, SiOC may be formed by disposing a carbon containing silane, such as methyl silane. The carbon containing silane may be a substituted silane, such as a silane where a group including carbon, such as a methyl group ($CH_3$—), is substituted for at least one hydrogen in silane ($SiH_4$). A gas including the silane, and a source gas including oxygen such as $N_2O$, $O_2$, or the like together with a carrier gas such as $N_2$, $NH_3$, helium (He), or argon (Ar), or the like, may be used in a plasma enhanced chemical vapor deposition ("PECVD") method to provide the SiOC.

Although it has been described that the first insulating layer 112 includes SiOC, the invention is not limited thereto and the first insulating layer 112 may include another material instead of SiOC. In one or more exemplary embodiments, for example, the insulating material may include at least one of SiN, SiO, SiC, or SiON.

The amorphous carbon layer 114 may be formed through a chemical vapor deposition ("CVD") method such as by using a gas including carbon and hydrogen. The amorphous carbon layer 114 is formed to have an initial thickness taken perpendicular to the substrate 110. The deposition process of the amorphous carbon layer 114 may be performed at a temperature of about 50 degrees Celsius (° C.) to about 500° C. The gas including carbon and hydrogen may include at least one of $C_2H_4$, $C_3H_6$, or $C_4H_8$. When the amorphous carbon layer 114 is formed, an assistant gas may be additionally used, and the assistant gas may include at least one of helium or argon. The assistant gas serves to help stably perform a deposition process.

The second insulating layer 116 may include an oxide or a nitride, and, for example, may include at least one of SiN, SiO, or SiON.

The photosensitive film 118 may include a material for which a property changes due to light.

Figure 2:
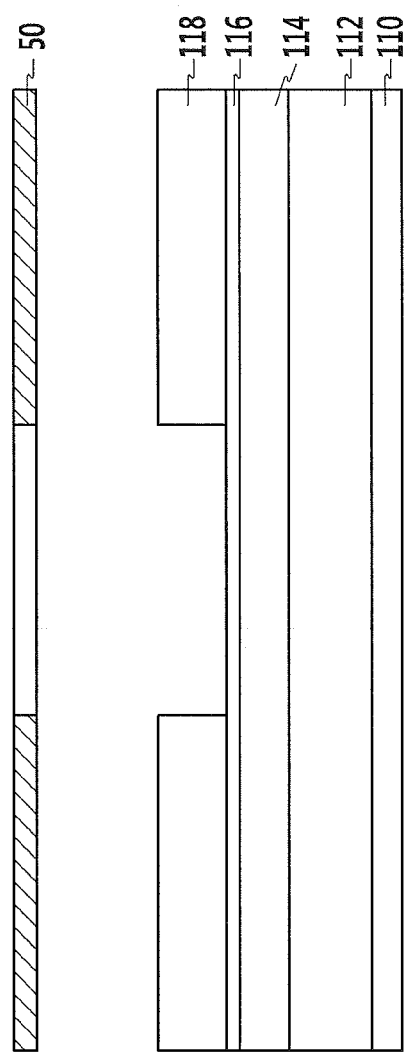

As shown in FIG. 2, a mask 50 where light can be transmitted through some regions thereof and light cannot be transmitted through other regions thereof is located on the substrate 110 including the first insulating layer 112, the amorphous carbon layer 114, the second insulating layer 116 and the photosensitive film 118 thereon. The photosensitive film 118 is exposed and developed using the mask 50, to be patterned. A portion of the second insulating layer 116 is exposed after etching and developing the photosensitive film 118 using the mask 50.

Figure 3:
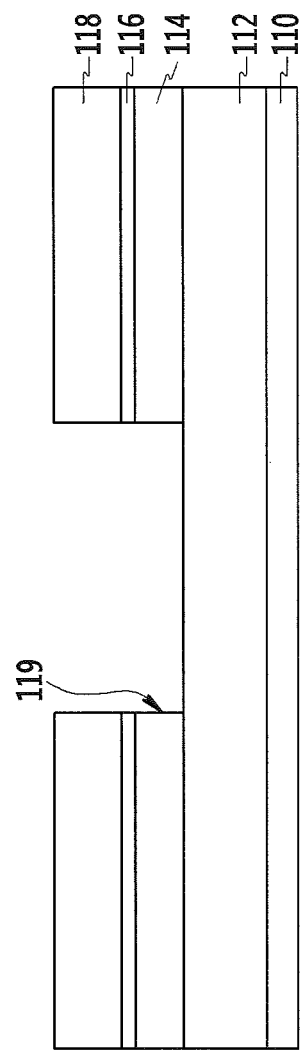

As shown in FIG. 3, the second insulating layer 116 is etched by using the patterned photosensitive film 118 as a mask. Thus, the exposed portion of the second insulating layer 116 is etched where the photosensitive film 118 is removed. A remaining portion of the second insulating layer 116 is located under the photosensitive film 118. A portion of the amorphous carbon layer 114 is exposed after etching the second insulating layer 116.

The etching process of the second insulating layer 116 may be performed by using a first primary etching gas. The first primary etching gas is a gas including fluorine, and for example, may include at least one of $SF_6$, $NF_3$, $CF_4$, $CHF_3$, $CH_2F_2$, $C_3F_8$, $C_4F_8$, $C_4F_6$, or $C_5F_8$.

Subsequently, the amorphous carbon layer 114 is etched by using the remaining portions of the photosensitive film 118 and/or the second insulating layer 116 as a mask, to form an opening 119. The exposed portion of the amorphous carbon layer 114 is etched where the second insulating layer 116 is removed. A remaining portion of the amorphous carbon layer 114 is located under the second insulating layer 116.

The etching process of the amorphous carbon layer 114 may be performed by using a second primary etching gas and an assistant etching gas. The second primary etching gas may be a gas including oxygen. The assistant etching gas may include at least one of hydrogen bromide or argon. The assistant etching gas serves to help stably perform an etching process.

Figure 4:
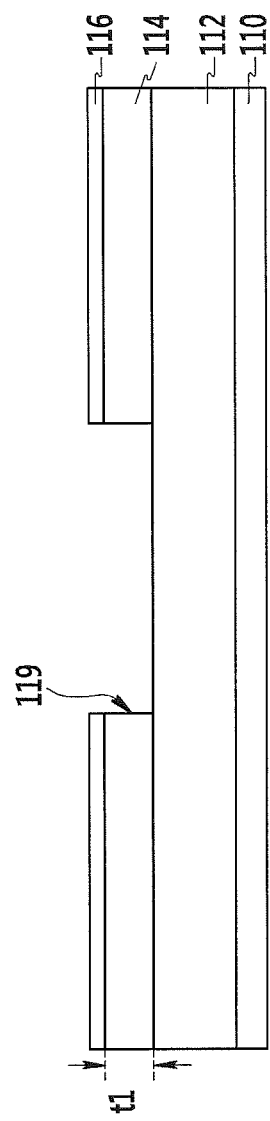

As shown in FIG. 4, the patterned photosensitive film 118 is removed. In this case, a thickness t1 of the amorphous carbon layer 114 is substantially the same as the initially formed thickness thereof.

Figure 5:
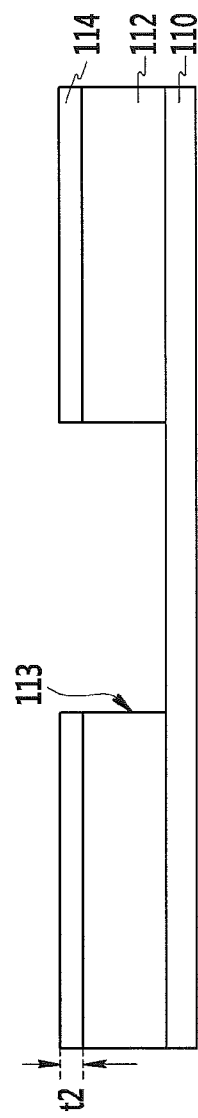

As shown in FIG. 5, the first insulating layer 112 is etched by using the amorphous carbon layer 114 including the opening 119 as a mask, to form a trench 113 in the first insulating layer 112. In etching the first insulating layer 112, the second insulating layer 116 may also be etched.

The etching process of the first insulating layer 112 may be performed by using the same gas as the gas for etching the second insulating layer 116, for example, the first primary etching gas. That is, the first primary etching gas including fluorine may be used, and for example, may include at least one of $SF_6$, $NF_3$, $CF_4$, $CHF_3$, $CH_2F_2$, $C_3F_8$, $C_4F_8$, $C_4F_6$, or $C_5F_8$.

According to the exemplary embodiment of the invention, the first insulating layer 112 is etched by using the amorphous carbon layer 114 as a mask, making it possible to further increase selectivity in etching as compared with the case of etching the first insulating layer 112 by using an existing photosensitive film as a mask.

Additionally, the amorphous carbon layer 114 may be further etched by using the first insulating layer 112 as a mask. Where an existing metallic mask is used to etch the first insulating layer 112, metallic foreign substances may be undesirably generated in the trench 113. However, by further etching the amorphous carbon layer 114 using the first insulating layer 112 as a mask, generation of the metallic foreign substances may be reduced or effectively prevented, to prevent contamination of the etched structure.

While the etching process of the first insulating layer 112 is performed, the second insulating layer 116 is also etched. The second insulating layer 116 is also etched when the first insulating layer 112 is etched because an entire upper surface of the second insulating layer 116 is exposed during etching of the first insulating layer 112, and the gas used in etching of the first insulating layer 112 is a material which can also etch the second insulating layer 116. The second insulating layer 116 may be entirely etched, for example, to remove an entire of the second insulating layer 116 from the etched structure.

After the second insulating layer 116 is entirely etched, an upper surface of the amorphous carbon layer 114 is exposed. Due to this, the amorphous carbon layer 114 is also influenced by the process of etching the first insulating layer 112, making it possible to etch some regions of the amorphous carbon layer 114 and to reduce the thickness of the amorphous carbon layer 114. As indicated in FIG. 5, a thickness t2 of the amorphous carbon layer 114 after completion of the etching the first insulating layer 112 is smaller than a thickness t1 of the amorphous carbon layer 114 before the completion of the etching process of the first insulating layer 112.

When some regions of the amorphous carbon layer 114 are etched, the thickness of the amorphous carbon layer 114 becomes thinner only in some regions, but an opening region which extends completely through the thickness of the amorphous carbon layer 114 is not created in the amorphous carbon layer 114. Since an opening region is not formed in the amorphous carbon layer 114, influence on the first insulating layer 112 located under the amorphous carbon layer 114 is reduced or effectively prevented. In contrast, the first insulating layer 112 located under the amorphous carbon layer 114 is undesirably influenced when the first insulating layer 112 is etched by using an existing photosensitive film as a mask.

Figure 6:
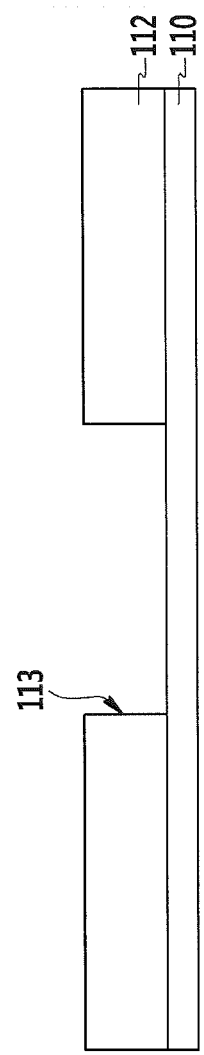

As shown in FIG. 6, the left amorphous carbon layer 114 may be removed. The amorphous carbon layer 114 may be removed by performing a front side etching process using the second primary etching gas and the assistant etching gas which have been earlier used to pattern the amorphous carbon layer 114. The second primary etching gas may be a gas including oxygen, and the assistant etching gas may include at least one of hydrogen bromide or argon.

In an alternative embodiment, the amorphous carbon layer 114 located on the first insulating layer 112 may not be removed but instead may remain on the first insulating layer 112.

Next, an exemplary embodiment of a metal wiring forming method according to the invention will be described hereinbelow with reference to the accompanying drawings.

Figure 7:
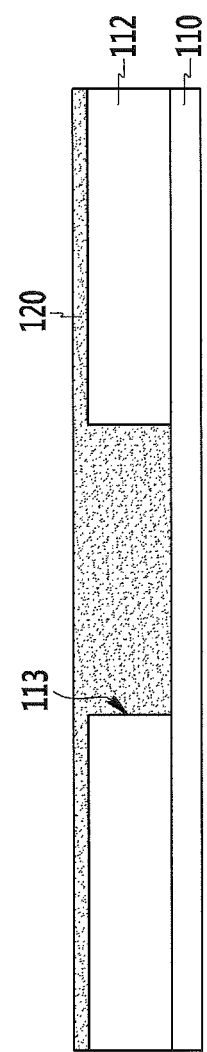
FIGS. 7 and 8 are cross-sectional views showing an exemplary embodiment of a metal wiring forming method according to the invention.
Figure 8:
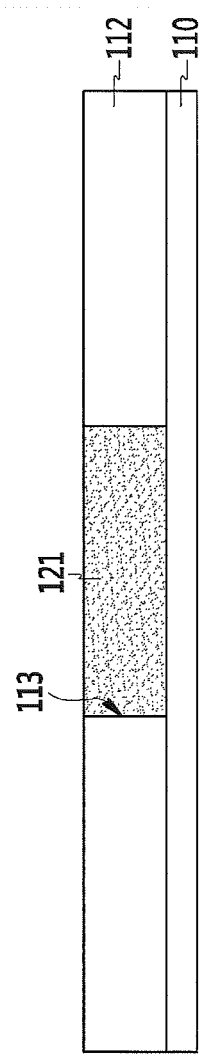

FIGS. 7 and 8 are cross-sectional views showing an exemplary embodiment of a metal wiring forming method according to the invention.

First, the first insulating layer 112 may be formed on the substrate 110 and the trench 113 may be formed extending into a thickness of the first insulating layer 112 by using the amorphous carbon layer 114 as a mask, through the above-described exemplary embodiment of the trench forming method according to the invention. The exemplary embodiment of the method of forming the trench 113 in the first insulating layer 112 has been described in detail, and will be omitted.

As shown in FIG. 7, a metal layer 120 is formed on and overlapping an entire surface of the substrate 110 including the first insulating layer 112. The metal layer 120 is formed on the first insulating layer 112, and is formed on the substrate 110 in the trench 113. The metal layer 120 may directly contact the substrate 110 at a bottom of the trench 113, and side and upper surfaces of the first insulating layer 112, but the invention is not limited thereto. In another exemplary embodiment where a portion of the amorphous carbon layer 114 remains on the first insulating layer 112, the metal layer 120 may directly contact side and upper surfaces of the amorphous carbon layer 114 in addition to surfaces of the substrate 110 and/or the first insulating layer 112. The formed metal layer 120 may be considered as filling the trench 113 since the metal layer 120 is in an entire of the trench 113 of the first insulating layer 112.

The metal layer 120 may include of copper (Cu). However, the invention is not limited to the case where the metal layer 120 includes copper (Cu). In one or more exemplary embodiments, the metal layer 120 may include a low-resistance metal.

As shown in FIG. 8, the metal layer 120 is polished such as through a chemical mechanical polishing ("CMP") process so that the metal layer 120 overlapping the first insulating layer 112 in a plan view, is removed. Accordingly, the metal layer 120 located in the trench 113 is left to form a metal wiring 121.

Since the metal wiring 121 is formed in the trench 113, a shape, dimension and/or profile (e.g., the form) of the metal wiring 121 follows the form of the trench 113. Thus, the trench 113 may be formed according to a design of the desired metal wiring 121, and the metal wiring 121 may be formed in the trench 113 such as only in the trench 113 of the etched structure.

In the exemplary embodiment of the metal wiring forming method according to the invention, the metal wiring 121 is formed while an interior of the trench 113 is not contaminated with metallic foreign substances. Thus, since the metal wiring 121 is formed with the interior of the trench 113 not being contaminated, the characteristics of the metal wire 121 can be further improved.

Further, since a final thickness of the first insulating layer 112 including the trench 113 is relatively large in units of μm, the metal wiring 121 formed in the trench 113 also has a relatively large thickness in units of μm. Thus, the metal wiring 121 is formed relatively thick to realize a low-resistance wiring.

Hereinafter, an exemplary embodiment of a method of manufacturing a thin film transistor array panel according to the invention will be described with reference to the accompanying drawings.

FIGS. 9 to 13 are cross-sectional views showing an exemplary embodiment of a method of manufacturing a thin film transistor array panel according to the invention.

First, the first insulating layer 112 may be formed on the substrate 110 and the trench 113 may be formed extending into a thickness of the first insulating layer 112 by using the amorphous carbon layer 114 as a mask, through the above-described exemplary embodiment of the trench forming method according to the invention. The exemplary embodiment of the method of forming the trench 113 on the first insulating layer 112 has been described in detail, and will be omitted.

Figure 9:
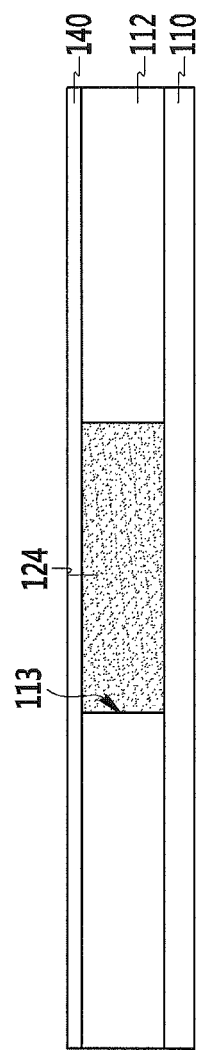
FIGS. 9 to 13 are cross-sectional views showing an exemplary embodiment of a method of manufacturing a thin film transistor array panel according to the invention.

As shown in FIG. 9, a gate electrode 124 may be formed in the trench 113 of the first insulating layer 112 through the exemplary embodiment of the metal wiring forming method according to the invention. The method of forming the gate electrode 124 in the trench 113 is the same as the method of forming the metal wire (121 of FIG. 8) in the trench 113 in the above-described exemplary embodiment of the metal wiring forming method according to the invention, and a description thereof will be omitted.

The gate electrode 124 may include a metallic material such as copper (Cu) and may have a thickness of about 3 μm. Thus, since the gate electrode 124 is formed to include a thick metallic material, the gate electrode 124 may be a low-resistance metal wiring, making it possible to transmit signals at high speed, for example, within the thin film transistor array panel and within a display device including the thin film transistor array panel.

After the gate electrode 124 is formed in the trench 113, a gate insulating film 140 is formed on the gate electrode 124. The gate insulating film 140 may be formed by depositing silicon oxide (SiOx) or silicon nitride (SiNx) on a front surface of the substrate 110 including the gate electrode 124. The gate insulating layer 140 may be formed on an entire of the front surface of the substrate 110 including the gate electrode 124.

Figure 10:
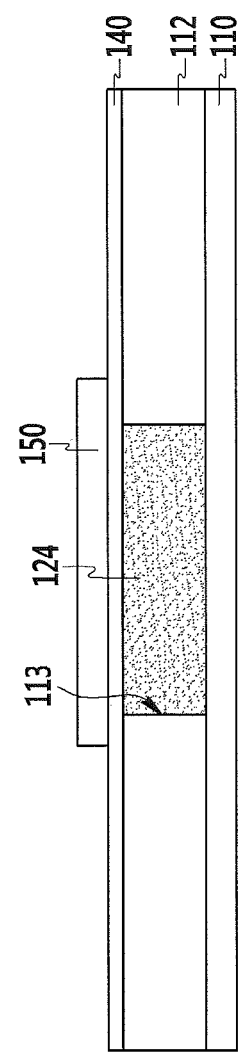

As shown in FIG. 10, a semiconductor layer 150 is formed on the gate insulating layer 140. The semiconductor layer 150 may be located on and overlapping a portion of an entire of the gate electrode 124 in a plan view.

The semiconductor layer 150 may include amorphous silicon, polycrystalline silicon (poly silicon), a metal oxide, or the like. When the semiconductor 150 includes a metal oxide, at least one oxide such as indium gallium zinc oxide ("IGZO"), zinc tin oxide ("ZTO"), indium tin oxide ("IZO"), or the like may be used.

Figure 11:
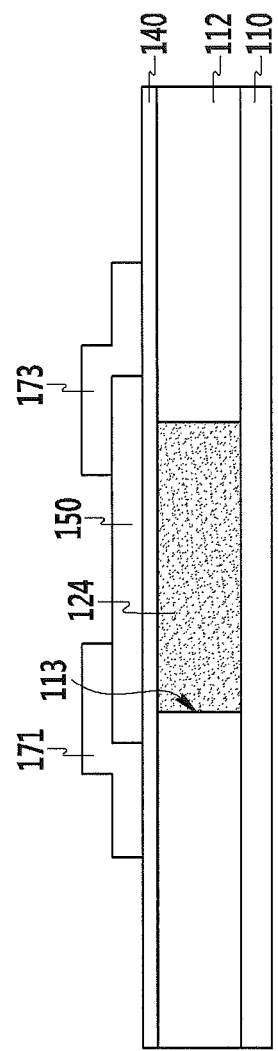

As shown in FIG. 11, a source electrode 171 and a drain electrode 173 are formed on the semiconductor layer 150, to be spaced apart from each other in the plan view. The source electrode 171 and the drain electrode 173 may be formed with a single layer, a dual layer and/or a multiple layer such as a triple layer, by using a metallic material. The source electrode 171 and/or a drain electrode 173 overlaps a portion of the gate electrode 124 and the semiconductor layer 150.

The source electrode 171 and the drain electrode 173 may be formed through the above-described exemplary embodiment of the metal wiring forming method according to the invention. That is, after a further insulating layer including SiOC is formed on the substrate 110, and a further trench is formed to extend through a thickness of the further insulating layer, the source electrode 171 and the drain electrode 173 such as including copper, may be formed in the further trench.

In this case, if the further insulating layer including SiOC is formed on the semiconductor layer 150 and the further trench is formed, the semiconductor layer 150 may be damaged in the etching process for forming the further trench. In order to reduce or effectively prevent damage to the semiconductor layer 150 during forming of the further trench, an etch stopper may be formed on the semiconductor layer 150, such as directly on the semiconductor layer 150, but the invention is not limited thereto or thereby. Alternatively, the semiconductor layer 150 may be formed after the source electrode 171 and the drain electrode 173 are formed, instead of the semiconductor layer 150 being formed first.

Figure 12:
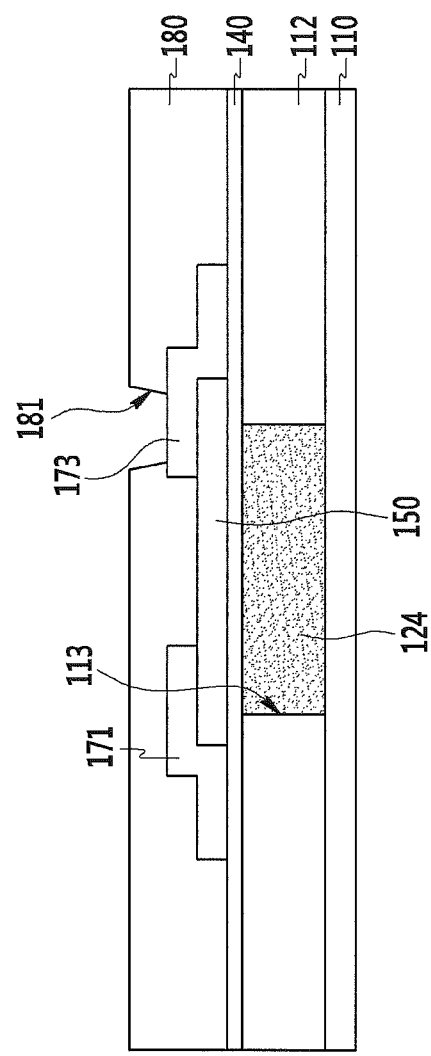

As shown in FIG. 12, a passivation film 180 is formed on the source electrode 171 and the drain electrode 173. The passivation film 180 may be a single layer film, such as including an inorganic insulating material or an organic insulating material, or may be a dual layer film including an inorganic insulating material and an organic insulating material.

Subsequently, a contact hole 181 is formed extending through a thickness of the passivation film 180. A portion of the drain electrode 173 is exposed by the contact hole 181 in the passivation layer 180.

Figure 13:
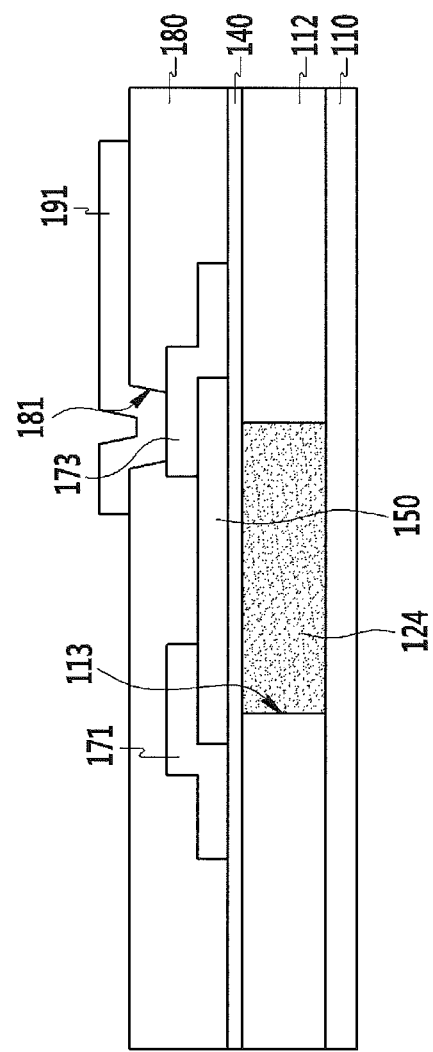

As shown in FIG. 13, a pixel electrode 191 is formed on the passivation film 180 to be connected to the drain electrode 173. The pixel electrode 191 may be connected to the drain electrode 173 through the contact hole 181. The pixel electrode 191 may include a transparent metal material such as at least one of indium tin oxide ("ITO"), indium zinc oxide ("IZO"), or the like.

Although not shown, a gate line which is connected to and continuous with the gate electrode 124, such as to transfer a gate signal, may be formed together with the gate electrode 124 in the process of forming the gate electrode 124 in FIG. 9. Further, a data line which is connected to and continuous with the source electrode 171, such as to transfer a data signal, may be formed together with the source electrode 171 in the process of forming the source electrode 171 and the drain electrode 173 in FIG. 16.

It has been described in the exemplary embodiments of the invention that one or more exemplary embodiments of the metal wire forming method according to the invention may be used when the gate electrode, the source electrode and the drain electrode are formed, but the invention is not limited thereto. In addition to the gate electrode, the source electrode and the drain electrode, other metal wirings in the thin film transistor array panel may be formed through one or more exemplary embodiments of the method of the metal wiring forming method according to the invention.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A method of forming a thin film transistor array panel, the method comprising:
providing a first insulating layer on a substrate;
providing an amorphous carbon layer on the first insulating layer;

providing a second insulating layer on the amorphous carbon layer;

providing an opening in the amorphous carbon layer, by patterning the second insulating layer and the amorphous carbon layer; and providing a trench in the first insulating layer, by etching the first insulating layer, the etching the first insulating layer using the amorphous carbon layer comprising the opening as a mask, wherein in the providing the amorphous carbon layer, the amorphous carbon layer is formed by using a gas comprising carbon and hydrogen, and an assistant gas comprising at least one of helium or argon, and the gas comprising carbon and hydrogen comprises at least one of $C_2H_4$, $C_3H_6$, or $C_4H_8$ providing a photosensitive film on the second insulating layer, and exposing and developing the photosensitive film, to pattern the photosensitive film; etching the second insulating layer by using the patterned photosensitive film as a mask; etching the amorphous carbon layer by using the second insulating layer as a mask, to form the opening; and removing the photosensitive film.

2. The method of claim 1, wherein:
the first insulating layer comprises at least one of SiN, SiO, SiC, SiOC, or SiON.

3. The method of claim 1, wherein:
the second insulating layer comprises at least one of SiN, SiO, or SiON.

4. The method of claim 1, wherein:
in the etching the second insulating layer of the providing the opening and in the etching the first insulating layer of the providing the trench,
the second insulating layer and the first insulating layer are etched by using a first primary etching gas, the first primary etching gas comprising fluorine.

5. The method of claim 4, wherein:
the first primary etching gas comprises at least one of $SF_6$, $NF_3$, $CF_4$, $CHF_3$, $CH_2F_2$, $C_3F_8$, $C_4F_8$, $C_4F_6$, or $C_5F_8$.

6. The method of claim 1, wherein:
in the etching the amorphous carbon layer of the providing the opening,
the amorphous carbon layer is etched by using a second primary etching gas, the second primary etching gas comprising oxygen.

7. The method of claim 6, wherein:
in the etching the amorphous carbon layer,
the amorphous carbon layer is etched by further using an assistant etching gas, and
the assistant etching gas comprises at least one of hydrogen bromide or argon.

8. The method of claim 1, wherein:
the providing the amorphous carbon layer comprises a chemical vapor deposition process.

9. The method of claim 8, wherein:
the providing the amorphous carbon layer is performed at a temperature of about 50° Celsius to about 500° Celsius.

* * * * *